United States Patent [19]
Baldasaro

[11] Patent Number: 5,959,239
[45] Date of Patent: Sep. 28, 1999

[54] THERMOVOLTAIC SEMICONDUCTOR DEVICE INCLUDING A PLASMA FILTER

[75] Inventor: Paul F. Baldasaro, Clifton Park, N.Y.

[73] Assignee: The United States of America as represented by the United States Department of Energy, Washington, D.C.

[21] Appl. No.: 08/867,064

[22] Filed: Jun. 2, 1997

[51] Int. Cl.[6] ................................................ H01L 35/34
[52] U.S. Cl. .................... 136/201; 136/205; 136/236.1; 136/240
[58] Field of Search .................. 136/255, 257, 136/252, 264, 201, 240, 236.1

[56] References Cited

U.S. PATENT DOCUMENTS

| | | | |
|---|---|---|---|
| 4,255,211 | 3/1981 | Fraas | 136/249 |
| 4,332,974 | 6/1982 | Fraas | 136/249 |
| 4,633,031 | 12/1986 | Todorof | 136/249 |
| 4,710,254 | 12/1987 | Garlick | 136/278 |
| 4,713,493 | 12/1987 | Ovshinsky | 136/249 |
| 5,091,018 | 2/1992 | Fraas et al. | 136/246 |
| 5,123,968 | 6/1992 | Fraas et al. | 136/246 |
| 5,304,255 | 4/1994 | Li et al. | 136/257 |
| 5,389,158 | 2/1995 | Fraas et al. | 136/244 |
| 5,403,405 | 4/1995 | Fraas et al. | 136/253 |
| 5,610,366 | 3/1997 | Fleurial et al. | 136/202 |
| 5,700,332 | 12/1997 | Brown et al. | 136/253 |

*Primary Examiner*—Kathryn Gorgos
*Assistant Examiner*—Erica Smith-Hicks
*Attorney, Agent, or Firm*—Virginia B. Caress; William R. Moser; Paul A. Gottlieb

[57] ABSTRACT

A thermovoltaic energy conversion device and related method for converting thermal energy into an electrical potential. An interference filter is provided on a semiconductor thermovoltaic cell to pre-filter black body radiation. The semiconductor thermovoltaic cell includes a P/N junction supported on a substrate which converts incident thermal energy below the semiconductor junction band gap into electrical potential. The semiconductor substrate is doped to provide a plasma filter which reflects back energy having a wavelength which is above the band gap and which is ineffectively filtered by the interference filter, through the P/N junction to the source of radiation thereby avoiding parasitic absorption of the unusable portion of the thermal radiation energy.

19 Claims, 4 Drawing Sheets

5,959,239

THERMOVOLTAIC SEMICONDUCTOR DEVICE INCLUDING A PLASMA FILTER

GOVERNMENT RIGHTS

This subject matter is pursuant to a U.S. Department of Energy contract.

FIELD OF THE INVENTION

The invention is directed to devices for efficiently converting radiant energy into an electrical potential. Specifically, a solid state thermovoltaic semiconductor is provided which includes a plasma-substrate filter which prevents the parasitic absorption of unusable radiant energy incident to the thermovoltaic semiconductor.

BACKGROUND OF THE INVENTION

Semiconductor devices for converting incident thermal radiation into an electrical potential are known in the art. These devices include a semiconductor P/N junction structure supported on a substrate. Thermal radiation focused on the P/N semiconductor junction results in photon energy being absorbed by an electron in a semiconductor valence band, creating a mobile electron in the conduction band and a mobile hole in the valence band. The diffusion of the mobile charge carriers interacts with the intrinsic electric field at the P/N junction separating positive and negative charge across the junction. Electrical potential is generated across the junction proportional to the incident thermal radiation intensity.

The use of such thermovoltaic semiconductors requires a thermal radiation wavelength which generates charge carriers in a P/N semiconductor junction. For a radiant source temperature less than 1500° K, the majority of thermal radiation energy is below the semiconductor band gap and unusable. To prevent the parasitic absorption of unusable energy, it is desirable to reflect energy which is not converted into electrical potential back to the source where it may be reabsorbed.

To avoid the generation of parasitic absorption by unusable radiant energy, various filtering techniques have been employed to filter out the unusable portion of the thermal radiation spectrum preventing it from reaching the P/N junction. Interference filters which have a sharp cut-off wavelength characteristic to provide a high reflection for unusable radiation have been employed for this purpose. These interference filters, however, have a relatively short effective stop band wavelength over which the radiation is reflected. Thus, above a certain wavelength, the filter becomes ineffective in blocking the higher wavelength portion of the unusable thermal radiation from reaching the P/N junction, thus, resulting in parasitic absorption of unusable energy which cannot be converted to an electrical potential.

The present invention is directed to reducing the parasitic absorption of this unusable energy which has heretofore not been completely reflected by state of the art interference filters.

SUMMARY OF THE INVENTION

The present invention is a solid state thermovoltaic semiconductor device which includes a plasma-substrate filter for reducing the absorption of energy outside the spectrum of usable thermal energy. The semiconductor plasma-substrate filter provides broadband reflection of incident radiant energy which lies outside of the spectrum useful for energy conversion back to the radiant energy source, while permitting thermal radiation within the usable energy spectrum to be converted by the P/N junction structure of the thermovoltaic semiconductor device to an electrical potential. The semiconductor thermovoltaic device employing the plasma-substrate semiconductor may also be used with an interference filter further enhancing the ability to isolate the P/N junction from thermal radiation energy which lies outside of the usable energy spectrum.

DESCRIPTION OF THE PREFERRED EMBODIMENT

Figure 1:
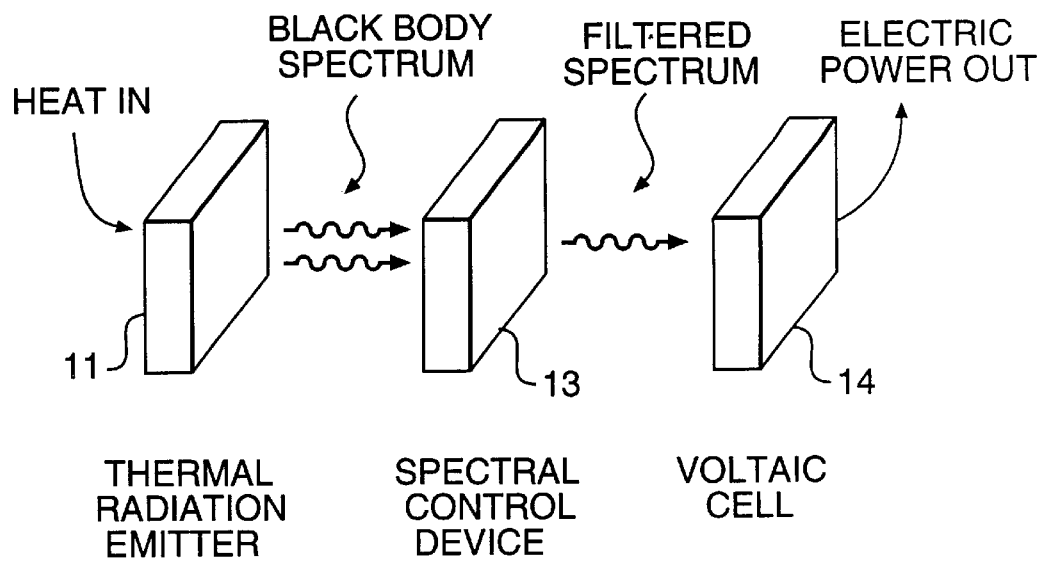
FIG. 1 illustrates the principal of thermovoltaic energy conversion.

Referring now to FIG. 1, the principle of converting radiant energy into an electrical potential is illustrated. A heat source 11 is used to emit a black body spectrum of thermal radiation which is converted by a semiconductor thermovoltaic cell 14 into an electrical potential. The thermal radiation is first filtered by a filter device 13 which limits the wavelength of the radiation incident to the thermovoltaic cell 14 to energy within the P/N junction bandgap of the semiconductor thermovoltaic cell which can be converted into an electrical potential. Energy which lies outside of the P/N junction bandgap is reflected back to the thermal radiation source 11, and avoids generating any parasitic absorption of unusable energy in the thermovoltaic cell 14.

Figure 2:
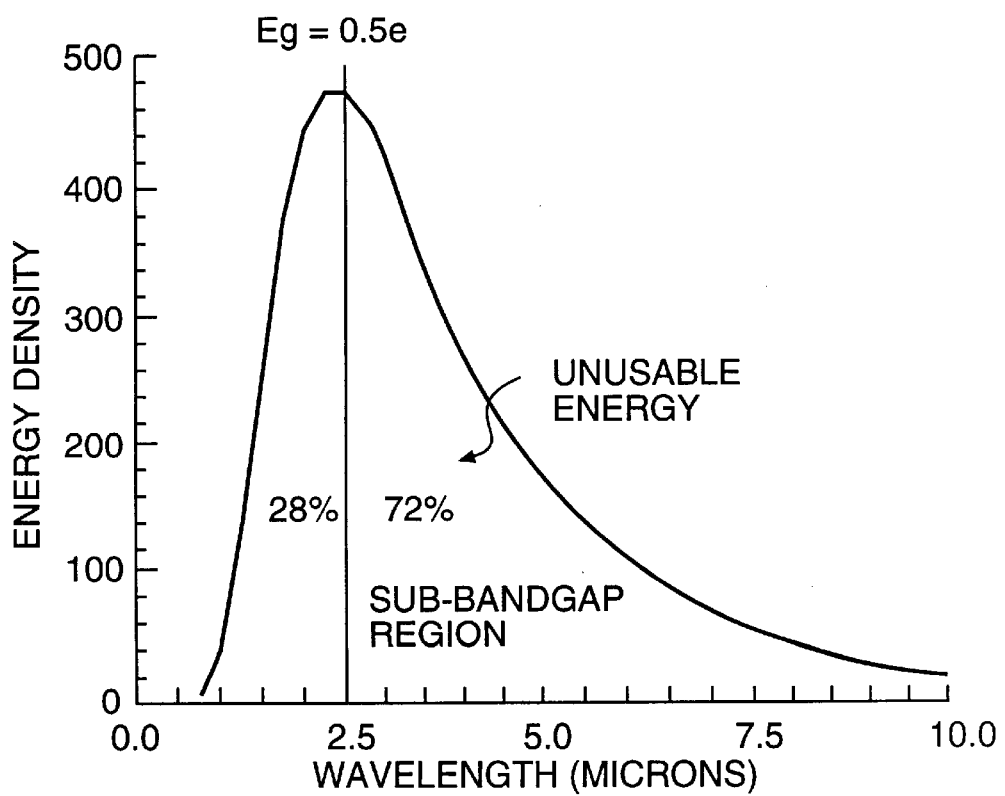
FIG. 2 illustrates the spectrum of thermal radiation which may be converted into an electrical potential.

The usable portion of the thermal radiation spectrum is illustrated more particularly with respect to FIG. 2. For wavelengths above 2.5 microns, significant thermal radiation is outside of a energy conversion spectrum. That portion of the thermal radiation spectrum below 2.5 microns is within the useful energy conversion spectrum, and passes through the filter device 13 radiating the thermovoltaic cell 14.

Figure 3:
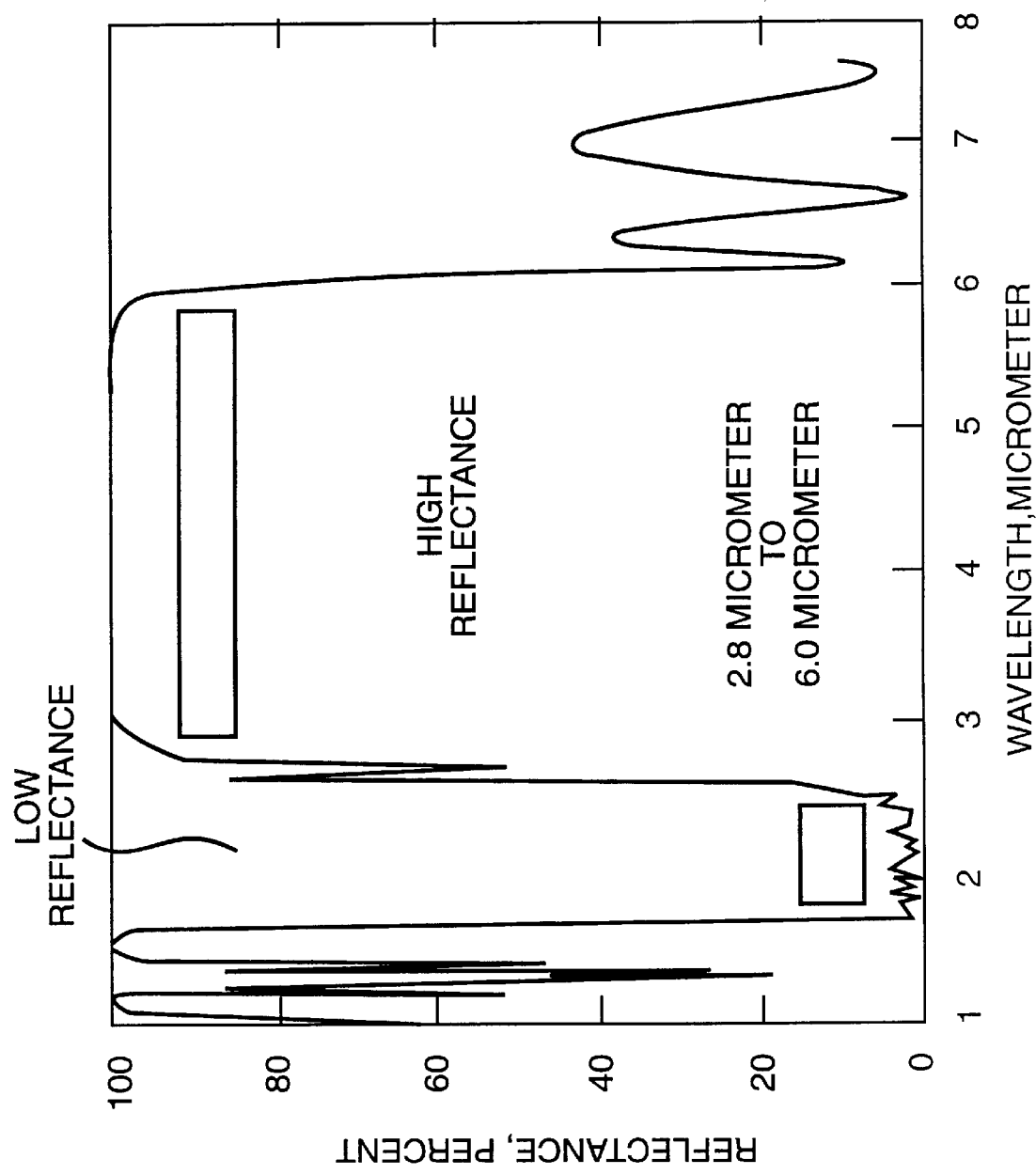
FIG. 3 illustrates the response of a typical dielectric interference filter used to prefilter the thermal radiation before it reaches the thermovoltaic semiconductor device.

While the foregoing is a theoretical description of the objective of prefiltering the black body thermal radiation spectrum, FIG. 3 illustrates the practical limitations of employing such prefiltering. A typical interference filter used for the filter device 13 includes a pass band for wavelength of effectively 1.5 to 2.5 microns. Between 2.5 and 6.1 microns of wavelength, the filter provides for a high reflectance of the unusable energy outside of the energy conversion spectrum. However, in wavelengths above 6.25 microns, the filtering is ineffective, and the unusable portion of the radiation spectrum above 6.25 microns is not effectively inhibited from reaching the thermovoltaic cell 14.

Figure 4:
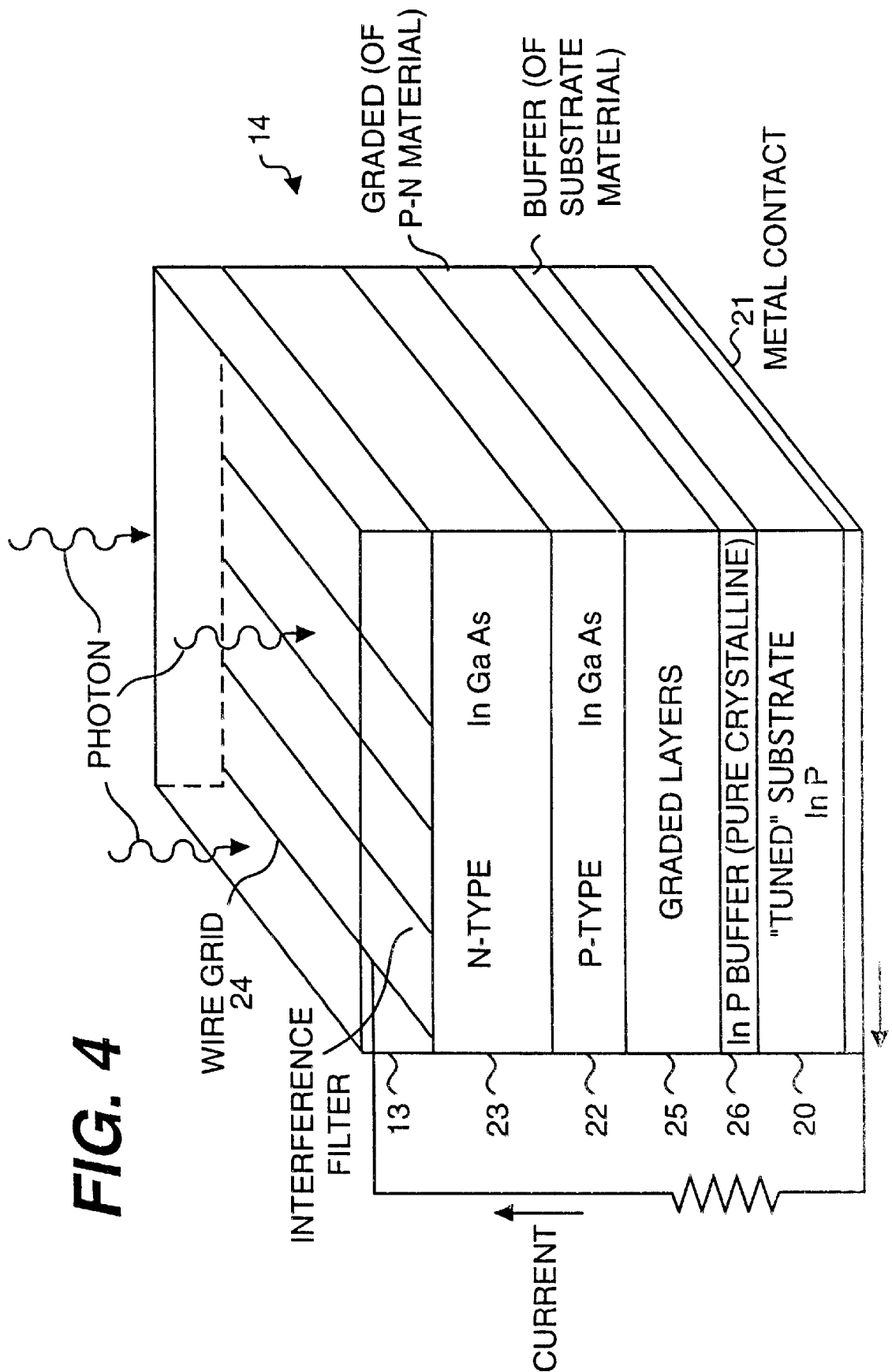
FIG. 4 illustrates the semiconductor device in accordance with a preferred embodiment which includes a plasma-substrate semiconductor filter for reflecting incident radiation which lies outside the usable energy spectrum.

In order to avoid the generation of parasitic absorption in the thermovoltaic cell 14 from non-usable energy above 6.25 microns, the present invention provides a plasma filter which is implemented in the thermovoltaic cell. FIG. 4 illustrates a semiconductor thermovoltaic cell having a plasma-substrate filter capable of reflecting thermal radiation above a stop band wavelength away from the P/N junction of the semiconductor thermovoltaic cell back to the thermal radiation source where it is absorbed.

The plasma filter, which is known in the solar radiation field as a heat mirror may be implemented in the substrate of a semiconductor thermovoltaic cell 14. As is typical of semiconductor devices, a substrate 20 includes on one side thereof a deposited metal contact which serves as an electrode 21. A P/N junction layer is implemented on the substrate by epitaxially growing a P-type layer 22 on the substrate, and epitaxially growing a N-type layer 23 on the P-type layer as is conventional in semiconductor processes. The substrate 20 may be of indium phosphide (InP) and the N-type and P-type layers 22, 23 may be indium gallium arsenide (InGaAs) or similar material such as quaternary InGaAsSb.

A buffer layer 26 is added to the substrate as an epitaxially grown pure crystalline layer of the same material as the substrate, which in turn supports an epitaxially grown graded layer(s) 25 comprising a graduated composition of diode material.

The plasma filter implemented in the substrate 20 may be implemented by doping the substrate layer 20 and/or the graded layer 25 supported on the indium phosphide (InP) substrate 20 with a tellurium (Te) or selenium (Se) dopant using many of the well known doping processes. The simplest of the doping processes is the direct incorporation of the Te dopant into the substrate crystal growth process. The InP substrate would be grown by bulk crystallization from a liquid melt, and the Te dopant can be incorporated in the InP melt prior to crystal growth becoming an intrinsic constituent of the InP substrate. Control over the dopant level is effected by controlling the amount of Te added to the InP melt. Other processes for doping the substrate includes ion implementation, and/or diffusion techniques known in the semiconductor art.

The doping level is selected to induce a plasma reflection at wavelengths above the usable energy wavelength where prefiltering is ineffective. In the example, in accordance with FIG. 3, this ineffective region is for wavelengths above 6.0 microns. To effectively provide plasma filtering at these wavelengths, a doping level of approximately $10^{20}/cm^3$ is adequate to achieve an adequate reflectance characteristic.

The basic substrate layer is effectively greater than 10 mils thick, and each of the N-type and P-type layers 22, 23 are 0.25 to 1 micron, and 1–5 microns thick respectively. The buffer layer 26 having a thickness of 1–5 microns, and the graded layer 25 having a thickness of about 2–5 microns are deposited expitaxially on the basic substrate 20 before depositing the N- and P-type layers 22, 23. The remaining electrode comprises a wire grid 24 which may be implemented by depositing metal through evaporation, onto the N-type layer 23 in the form of individual grid wires. The electrodes 21, 24 may then be annealed at an elevated temperature to ensure their electrical contact with the N-type layer 23 and substrate 20 respectively.

It is also possible to use other well known semiconductor fabricating materials, such as a indium arsenide (InAs), gallium antimonide (GaSb), gallium arsenide (GaAs), indium antimonide (InSb), indium gallium arsenide (InGaAs), indium gallium antimonide (InGaSb), and indium phosphorus arsenide (InPAs) as substrate materials. A wide variety of quaternary InGaAsSb compositions for the P-type and N-type active layers 22, 23 may be implemented in an alternative embodiment.

Figure 5:
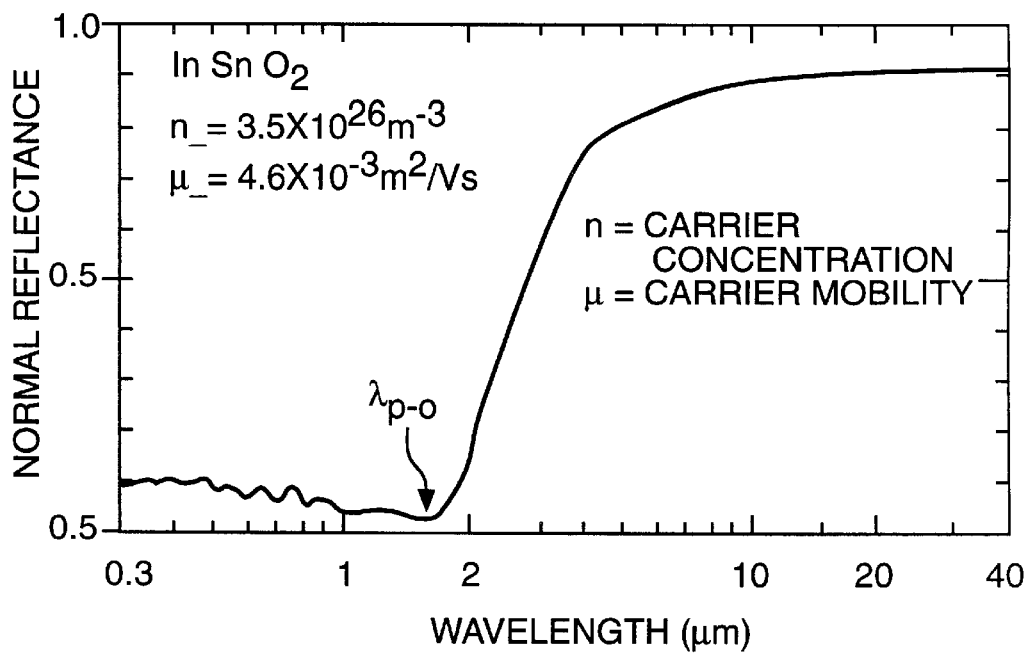
FIG. 5 illustrates the reflectance of a prior art plasma-substrate semiconductor filter made of $InSnO_2$ (indium-tin-oxide).

High plasma reflectivity in the higher wavelength portions of the incident radiation spectrum is achievable by controlling the electron mobility in the semiconductor. FIG. 5 illustrates the reflection characteristic obtained in a plasma filter which is formed of indium-tin-oxide.

Figure 6:
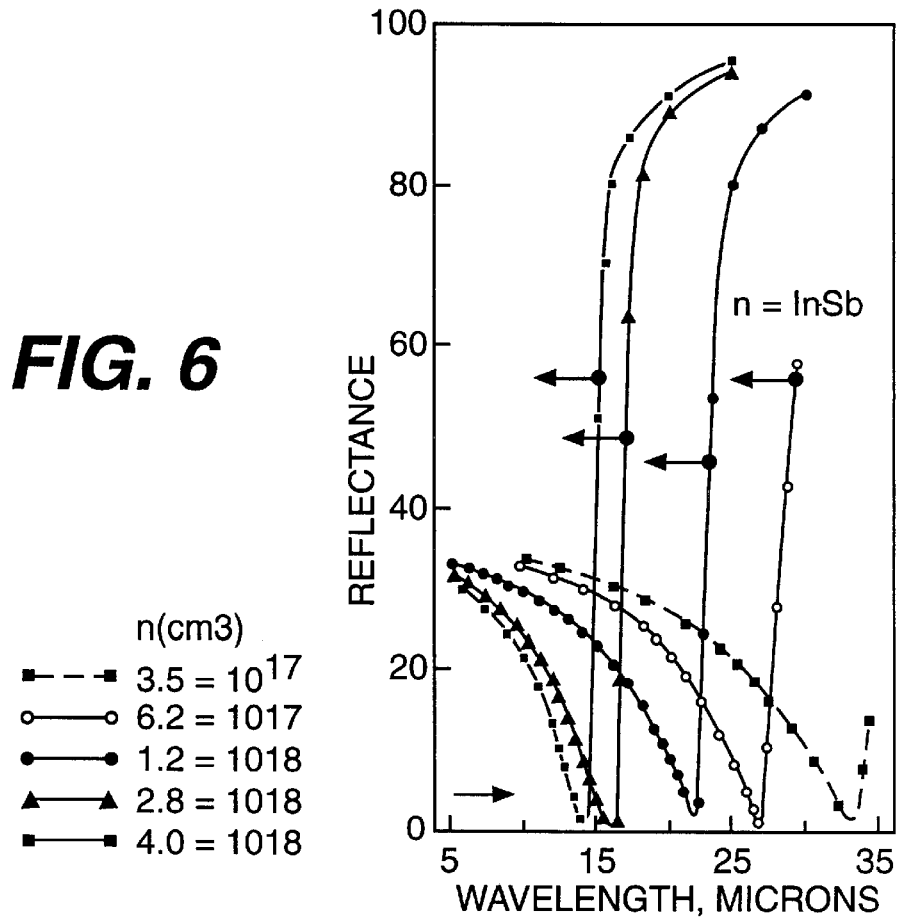
FIG. 6 illustrates the reflectance obtained for a plasma-substrate semiconductor filter of another embodiment of the invention which uses an indium-antimonide substrate.

Shown in FIG. 6 are the plasma reflection characteristic for an indium antimonide substrate, having doping levels of 1.2, 2.8, 3.5, 4.0 and 6.2 to $10^{18}/cm^3$, which, at a doping level of $4.0\times10^{18}/cm^3$ is over 95% above wavelengths of 15 microns. Other highly doped substrates using similar III–V compounds used in thermovoltaic applications, such as those listed above and others would also produce similar results. The plasma filter of the invention substantially reflects thermal energy having a wavelength in the region of 2.5 to 20 microns.

The thermovoltaic cell of FIG. 4 includes an interference filter for prefiltering the energy spectrum. An interference filter can be employed by depositing a layer of material of approximately 4 to 60 microns thick above the N-type layer 23 and wire grid 24. The interference filter may be a dielectric interference filter or any narrow gap (short range) filter, known in the art, which is deposited by vapor deposition, or other well known methods, directly on the photovoltaic device.

The foregoing embodiment which is represented by FIG. 4, avoids the drawback of placing both interference filter and plasma filter in front of the P/N junction, thus, avoiding the absorption of usable above bandgap energy by using the plasma filter to prefilter the thermal radiation. Placing the plasma filter on the opposite side of the P/N junction avoids the absorption of usable energy, while reflecting the unusable higher wavelength radiation back through the P/N junction to the thermal radiator.

The foregoing process permits the implementation of a plasma filter directly in the substrate, as part of the normal semiconductor fabrication processes. By controlling dopant levels of the substrate material, a plasma filter characteristic may be created which complements an interference filter reflection property, thus ensuring that only thermal radiation within the energy conversion spectrum is absorbed by the P/N junction.

Those skilled in the art will recognize yet other embodiments of the invention described more particularly by the claims which follow.

What is claimed is:

1. A thermovoltaic energy conversion device for converting thermal energy to an electric potential comprising:

an interference filter for passing a lower wavelength portion of said thermal energy;

a substrate having a buffer layer and graded layer on one surface thereof, said graded layer supporting a P/N junction, said P/N junction including a conductive contact which forms, with a contact on said substrate, electrodes for producing an electric potential in response to thermal energy transmitted by said interference filter; and a plasma filter included in at least one of said graded layer or said substrate, for reflecting incident thermal energy, which is not converted to an electrical potential, through said junction towards said interference filter;

wherein said interference filter is deposited on said P/N junction, and said P/N junction is between said plasma filter and said interference filter.

2. The thermovoltaic energy conversion device of claim 1 wherein said plasma filter is provided by a dopant material added to said substrate.

3. The thermovoltaic energy conversion device according to claim 2 wherein said dopant material is tellurium (Te) or selenium (Se).

4. The thermovoltaic energy conversion device according to claim 2 wherein said dopant material doping level is approximately $10^{20}/cm^3$.

5. The thermovoltaic energy conversion device according to claim 1 wherein said substrate is selected from indium arsenide (InAs), gallium antimonide (GaSb), indium antimonide (InSb), indium phosphide (InP), gallium arsenide (GaAs), indium gallium arsenide (InGaAs), indium gallium antimonide (InGaSb), and indium phosphorus arsenide (InPAs).

6. The thermovoltaic energy conversion device as claimed in claim 1, wherein said plasma filter is provided by a dopant material added to said substrate and said graded layer.

7. The thermovoltaic energy conversion device as claimed in claim 1, wherein said plasma filter is provided by a dopant material added only to said graded layer.

8. A thermovoltaic energy conversion device comprising:
   a black body source of thermal radiation;
   an interference filter for passing a lower wavelength portion of said thermal radiation spectrum and reflecting a higher wavelength portion of said thermal radiation;
   a thermovoltaic cell for converting said lower wavelength thermal radiation into an electric current, said thermovoltaic cell including a P/N junction disposed over a substrate, said substrate including a plasma filter which reflects higher wavelength thermal radiation, which is not reflected by said interference filter, back through said substrate and said P/N junction to said black body source; wherein said P/N junction is disposed between said interference filter and said substrate.

9. The thermovoltaic energy conversion device of claim 8 wherein said plasma filter is formed by doping said substrate to obtain a plasma reflection of thermal radiation in a spectrum which is not reflected by said interference filter.

10. The thermovoltaic energy conversion device of claim 9 wherein said substrate is selected from indium phosphide (InP), indium antimonide (InSb), gallium arsenide (GaAs), indium gallium arsenide (InGaAs), indium gallium antimonide (InGaSb), indium phosphorus arsenide (InPAs), gallium antimonide (GaSb) or indium arsenide (InAs).

11. The thermovoltaic energy conversion device of claim 10 wherein said substrate is doped with tellurium (Te) or selenium (Se).

12. The thermovoltaic energy conversion device of claim 10 wherein said substrate is doped at a doping level of $4\times10^{18}/cm^3$.

13. The thermovoltaic energy conversion device of claim 9 herein said doping is done by direct incorporation of a dopant in the crystal growth process of said substrate.

14. The thermovoltaic energy conversion device of claim 8 wherein said plasma filter substantially reflects thermal energy having a wavelength in the region of 2.5 to 20 microns.

15. A method for converting thermal energy into electrical energy comprising:
   emitting thermal energy from a black body;
   filtering said thermal energy with an interference filter to reflect a higher wavelength portion of said thermal energy to said black body while passing a remaining portion of said thermal energy;
   filtering said remaining portion of said thermal energy with a plasma substrate filter implemented in a substrate to reflect higher wave length thermal energy unfiltered by said interference filter back to said black body; and
   placing a P/N junction on said plasma substrate filter, between said interference filter and said substrate, in the path of said remaining portion of said thermal energy to convert said remaining portion of thermal energy into an electrical current.

16. The method for converting thermal energy according to claim 15 wherein said step of implementing a plasma energy filter includes the step of doping said substrate at a doping level of $4\times10^{18}/cm^3$ with a doping material.

17. The method for converting thermal energy according to claim 16 wherein said substrate is selected from the group including indium antimonide (InSb), indium phosphide (InP), indium arsenide (InAs), gallium antimonide (GaSb), gallium arsenide (GaAs), indium phosphorus arsenide (InPAs), indium gallium arsenide (InGaAs), and indium gallium antimonide (InGaSb).

18. The method of claim 16 wherein said step of doping is done by direct incorporation of said doping material in the substrate crystal growth process.

19. The method for converting thermal energy according to claim 15 wherein said plasma filter reflects energy to said black body which lies in the range of 2.5 to 20 microns.

* * * * *